(12) United States Patent
Komatsu et al.

(10) Patent No.: US 12,074,194 B2
(45) Date of Patent: Aug. 27, 2024

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Kanako Komatsu, Yokohama Kanagawa (JP); Daisuke Shinohara, Yokohama Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 17/686,014

(22) Filed: Mar. 3, 2022

(65) Prior Publication Data

US 2023/0087733 A1 Mar. 23, 2023

(30) Foreign Application Priority Data

Sep. 22, 2021 (JP) .................................. 2021-154191

(51) Int. Cl.
*H01L 29/06* (2006.01)
*H01L 29/417* (2006.01)
(Continued)

(52) U.S. Cl.
CPC .... *H01L 29/0607* (2013.01); *H01L 29/41775* (2013.01); *H01L 29/42356* (2013.01); *H01L 29/7816* (2013.01)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 7,521,768 B2   4/2009  Theeuwen et al.
9,871,132 B1*  1/2018  Liu ..................... H01L 29/7835
(Continued)

FOREIGN PATENT DOCUMENTS

JP   2001-320047 A   11/2001
JP   2007-503717     2/2007
(Continued)

*Primary Examiner* — Moin M Rahman
(74) *Attorney, Agent, or Firm* — Knobbe Martens Olson & Bear LLP

(57) ABSTRACT

According to one embodiment, a semiconductor device includes: a semiconductor substrate; a first well of a first conductivity type in a surface region that comprises a surface of the semiconductor substrate; a first impurity region of a second conductivity type in a region of a surface of the first well; a second impurity region of the second conductivity type, a portion of the first well being located between the second impurity region and the first impurity region in the surface region of the semiconductor substrate; a first insulating body on the surface of the semiconductor substrate; a gate electrode extending over part of the first well and part of the second impurity region on the first insulating body; a second insulating body extending on an upper surface of the gate electrode and over a region above the second impurity region; and a first conductive body on the second insulating body.

11 Claims, 5 Drawing Sheets

(51) Int. Cl.
*H01L 29/423* (2006.01)
*H01L 29/78* (2006.01)

(58) Field of Classification Search
CPC ......... H01L 27/10826; H01L 27/10879; H01L 27/1211; H01L 29/41791; H01L 2924/13067; H01L 29/0607; H01L 29/41775; H01L 29/42356; H01L 27/0629; H01L 29/0653; H01L 29/42368; H01L 29/404; H01L 21/31051; H01L 27/0207; H01L 29/0649; H01L 21/32115; H01L 21/823828; H01L 29/0657; H01L 29/4966; H01L 29/66545; H01L 29/4983; H01L 29/785; H01L 29/1037; H01L 29/66659; H01L 21/28088; H01L 29/41741; H01L 29/04–045; H01L 29/16–1608; H01L 29/18–185; H01L 29/22–2206; H01L 29/66674–66734; H01L 29/7801–7826; H01L 29/36–365; H01L 29/0856–0869; H01L 29/0873–0886; H01L 29/7833–7836
See application file for complete search history.

(56) References Cited

U.S. PATENT DOCUMENTS

| | | |
|---|---|---|
| 2001/0025961 A1 | 10/2001 | Nakamura et al. |
| 2002/0197860 A1 | 12/2002 | Baek |
| 2008/0054994 A1 | 3/2008 | Shibib et al. |
| 2010/0314675 A1 | 12/2010 | Ko et al. |
| 2015/0325693 A1 | 11/2015 | Mori |
| 2016/0181358 A1* | 6/2016 | Zhang ................. H01L 29/0865 438/283 |
| 2017/0243971 A1* | 8/2017 | Komatsu ........... H01L 29/42368 |
| 2017/0372985 A1 | 12/2017 | Birner et al. |
| 2019/0288063 A1* | 9/2019 | Komatsu ............. H01L 29/0696 |
| 2021/0083089 A1 | 3/2021 | Komatsu |

FOREIGN PATENT DOCUMENTS

| | | |
|---|---|---|
| JP | 2008-034738 A | 2/2008 |
| JP | 2009-290140 | 12/2009 |
| JP | 2012-178411 | 9/2012 |
| JP | 2015-216218 A | 12/2015 |
| JP | 2021-048168 A | 3/2021 |

* cited by examiner

SEMICONDUCTOR DEVICE

CROSS-REFERENCE TO RELATED APPLICATION(S)

This application is based upon and claims the benefit of priority from Japanese Patent Application No. 2021-154191, filed Sep. 22, 2021, the entire contents of which are incorporated herein by reference.

FIELD

Embodiments described herein relate generally to a semiconductor device.

BACKGROUND

A semiconductor device is used for electric power control and the like. Such a semiconductor device is required to have a high breakdown voltage, a low on-resistance, and high reliability.

Examples of related art include US-A-2010/0314675, US-A-2008/0054994, and US-A-2002/0197860.

DETAILED DESCRIPTION

Embodiments provide a semiconductor device having a high breakdown voltage, a low on-resistance, and high reliability.

In general, according to one embodiment, a semiconductor device includes: a semiconductor substrate; a first well of a first conductivity type in a surface region that comprises a surface of the semiconductor substrate; a first impurity region of a second conductivity type in a region of a surface of the first well; a second impurity region of the second conductivity type, a portion of the first well being located between the second impurity region and the first impurity region in the surface region of the semiconductor substrate; a first insulating body on the surface of the semiconductor substrate; a gate electrode extending over part of the first well and part of the second impurity region on the first insulating body; a second insulating body extending on an upper surface of the gate electrode and over a region above the second impurity region; and a first conductive body on the second insulating body.

Embodiments will be described hereinafter with reference to the drawings. In the following descriptions, elements having substantially same functions and configurations are denoted by the same reference signs and repetitive descriptions are often omitted. To mutually distinguish a plurality of elements having substantially the same functions and configurations, suffixes (such as numbers or characters) are often added to ends of the reference signs.

The drawings are schematic and relationships between thicknesses and plane dimensions, proportions of thicknesses of layers, and the like may differ from actual relationships and the like. Furthermore, the drawings may include parts different in a relationship and proportions of dimensions therebetween. Each embodiment is to illustrate an example of a device or a method for embodying a technical concept of the embodiment and the technical concept of the embodiment does not specify materials, shapes, structures, disposition, and the like of constituent components to the following.

The embodiments will be described hereinafter using an xyz orthogonal coordinate system. In the following descriptions, a description "down" and derivatives and related terms of "down" refer to a position of smaller coordinates on a z-axis, and a description "up" and derivatives and related terms of "up" refer to a position of larger coordinates on the z-axis.

1. First Embodiment

1.1. Structure (Configurations)

Figure 1:
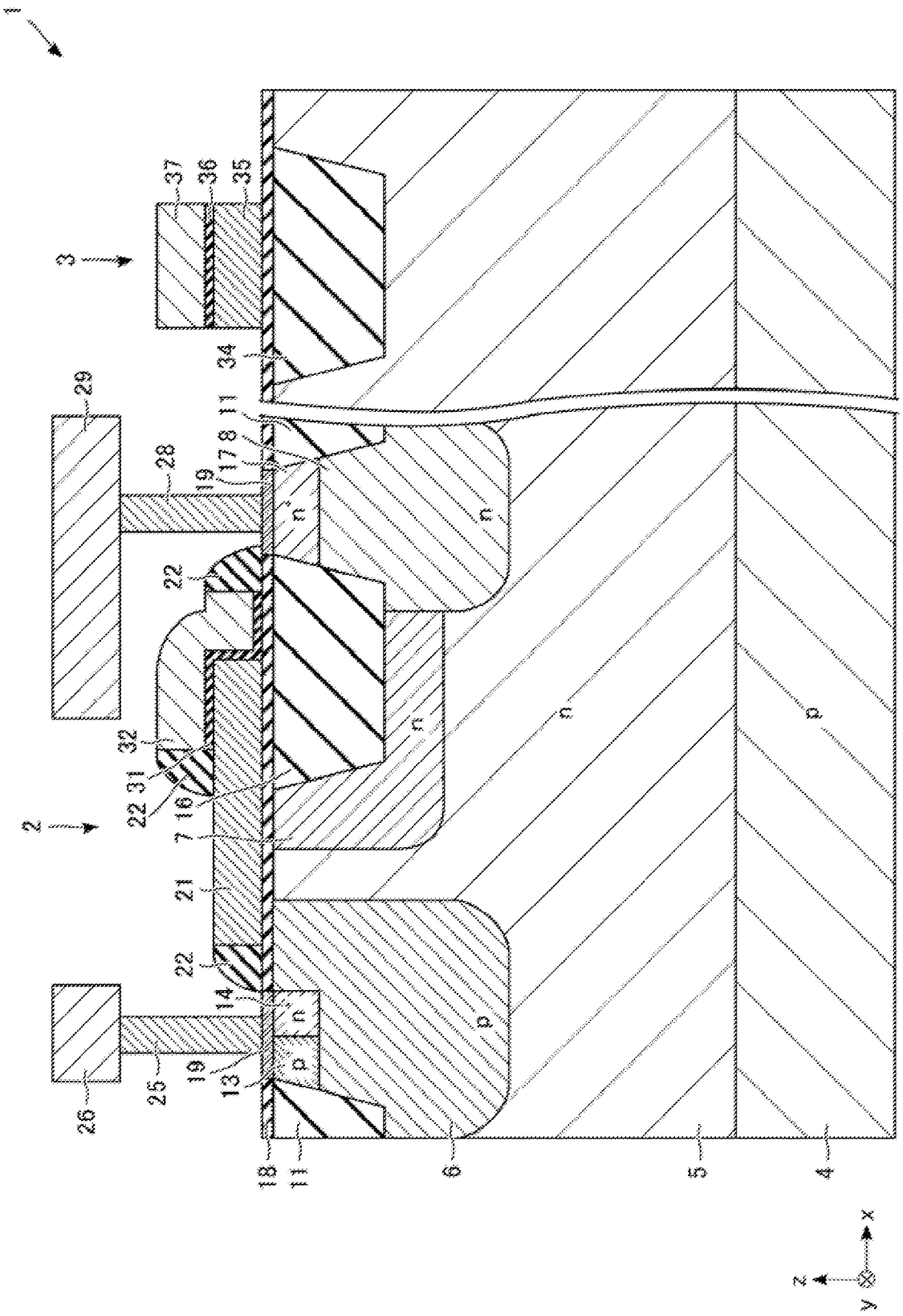
FIG. 1 illustrates a cross-sectional structure of a semiconductor device according to a first embodiment.

FIG. 1 illustrates a cross-sectional structure of a semiconductor device according to a first embodiment. As illustrated in FIG. 1, a semiconductor device 1 includes a transistor 2 and a capacitor 3. The transistor 2 is a MOSFET (Metal Oxide Semiconductor Field Effect Transistor) having a planar structure (or of a planar type) and may have any of structures in which a source, a gate electrode, and a drain are aligned on an xy plane. Such structures include a DMOS (Double Diffused Metal Oxide Semiconductor field effect transistor), an LDMOS (Laterally Diffused Metal Oxide Semiconductor field effect transistor), a DEMOS (Drain Extended Metal Oxide Semiconductor field effect transistor), an EDMOS (Extended Drain Metal Oxide Semiconductor field effect transistor). FIG. 1 and the following descriptions are based on an example in which the transistor 2 is the LDMOS. The other examples can be analogized by persons having ordinary skill in the art from the following descriptions, and some of the other examples are described later.

As illustrated in FIG. 1, the semiconductor device 1 includes, for example, a silicon substrate 4. The substrate 4 has p-type elements and regions. The p-type elements and regions each contain p-type carriers. When the p-type element or region contains both n-type impurities and p-type impurities, the p-type element or region has a higher p-type impurity concentration than an n-type impurity concentration.

An n-type deep well or impurity region (deep n-well) 5 is formed in a region that contains an upper surface of the substrate 4. A p-type well or impurity region (p-well) 6 is provided in a region that contains an upper surface of the deep n-well 5. N-type elements and regions each contain n-type carriers. When the n-type element or region contains both n-type impurities and p-type impurities, the n-type element or region has a higher n-type impurity concentration than a p-type impurity concentration. Part of the p-well 6 functions as a body region of the transistor 2, as will be described later.

An n-type drift region (impurity region) 7 is provided in the region that contains the upper surface of the deep n-well 5. The n-type drift region 7 either may or may not come in contact with the p-well 6.

An n-type well (impurity region) 8 is provided in the region that contains the upper surface of the deep n-well 5. The n-well 8 is located farther from the p-well 6 than the n-type drift region 7. The n-well 8 comes in contact with the n-type drift region 7.

An insulating body (insulating body layer) 11 is provided in the region that contains the upper surface of the deep n-well 5. The insulating body 11 surrounds the transistor 2 on an xy plane (in a plan view) and functions as an element isolation insulating body. Part of the insulating body 11 is located in a region that contains an upper surface of the p-well 6. Another part of the insulating body 11 is located in a region that contains an upper surface of the n-well 8. The insulating body 11 is formed by STI (Shallow Trench Isolation).

The region that contains a surface of the p-well 6 functions as the body region of the transistor 2. A region that contains the upper surface in the body region functions as a channel region. The channel region is a region where a channel is formed while the transistor 2 is turned on.

A p$^+$-type back gate region 13 is provided in the region that contains the upper surface of the p-well 6. Superscripts "+" and "−" of "n" or "p" indicating a conductivity type represent relative carrier concentrations. A p$^+$-type region, for example, has a higher carrier concentration than a carrier concentration of a p-type region. The carrier concentration refers to a concentration of p-type impurities excluding an amount of p-type impurities that are offset by n-type impurities when a region having the carrier concentration contains both p-type impurities and n-type impurities. The same is true for an n-type region, i.e., a description obtained by respectively replacing "n" and "p" with "p" and "n" in the description regarding the p-type impurities applies to a description regarding the n-type impurities.

An n$^+$-type source region 14 is provided in the region that contains the upper surface of the p-well 6. A silicide 19 is provided on surfaces of the p$^+$-type back gate region 13 and the n$^+$-type source region 14.

An insulating body 16 is provided in a region that contains upper surfaces of the n-type drift region 7 and the n-well 8. The insulating body 16 extends over the n-type drift region 7 and the n-well 8. A bottom surface of the insulating body 16 does not overlap a bottom surface of the n-type drift region 7, and part of the n-type drift region 7 is, therefore, located below the insulating body 16. An edge farther from the n-well 8 out of two edges of the insulating body 16 aligned along an x-axis does not overlap an edge farther from the n-well 8 out of two edges of the n-type drift region 7. Part of the n-type drift region 7 is, therefore, located sideways of the insulating body 16. The insulating body 16 is formed by the STI and formed in, for example, the same process as a process of forming the insulating body 11.

An n$^+$-type drain region 17 is provided in a region that contains an upper surface of the n-well 8. The silicide 19 is provided on a surface of the n$^+$-type drain region 17.

An insulating body 18 is provided on an upper surface of the substrate 4, i.e., on the upper surface of the deep n-well 5. The insulating body 18 is located on upper surfaces of the p-well 6, the n-type drift region 7, and the n-well 8. Part of the insulating body 18 functions as a gate insulating body of the transistor 2.

A conductive body 21 is provided on part of an upper surface of the insulating body 18. The conductive body 21 extends along the x-axis and continuously extends over at least a region above the p-well 6 and a region above the insulating body 16. The conductive body 21 functions as a gate electrode of the transistor 2. Since the conductive body 21 is provided continuously, the overall conductive body 21 has the same potential and functions as the gate electrode by applying a potential to the conductive body 21. The conductive body 21 is often referred to as "gate electrode 21," hereinafter. The part of the insulating body 18 below the gate electrode 21 functions as a gate insulating body of the transistor 2. The gate electrode 21 contains, for example, conductive polysilicon or is formed from, for example, conductive polysilicon. An upper part, which contains an upper surface, of the gate electrode 21 may contain a silicide.

One side surface (side surface on a side on which the p-well 6 is located) out of two side surfaces of the gate electrode 21 aligned along the x-axis is covered with a side wall insulating body 22. The side wall insulating body 22 may be configured from a plurality of sets of insulating bodies. Part of the side wall insulating body 22 is located above the p-well 6.

A contact plug 25 is provided on the silicide 19 on the surfaces of the p$^+$-type back gate region 13 and the n$^+$-type source region 14. A bottom surface of the contact plug 25 comes in contact with the silicide 19.

A conductive body 26 is provided on an upper surface of the contact plug 25. The conductive body 26 functions as part of a node connected to a source of the transistor 2.

A contact plug 28 is provided on the silicide 19 on the surface of the n$^+$-type drain region 17. A bottom surface of the contact plug 28 comes in contact with the silicide 19. The contact plug 28 is often referred to as "drain contact plug 28," hereinafter.

A conductive body 29 is provided on an upper surface of the drain contact plug 28. The conductive body 29 functions as part of a node of a drain of the transistor 2 and is often referred to as "drain interconnection 29," hereinafter. The drain interconnection 29 extends from a region above the drain contact plug 28 to a region above the gate electrode 21. The drain interconnection 29 extends, for example, from the region above the contact plug 28 to a region above the insulating body 16. The drain interconnection 29 extends, for example, from the region above the contact plug 28 to a region slightly closer to the contact plug 28 than a boundary between the n-type drift region 7 and the insulating body 16.

An insulating body 31 continuously extends from part of a region on an upper surface of the gate electrode 21 to part of a region on the upper surface of the insulating body 18. The insulating body 31 has a first end and a second end aligned along the x-axis. The first end of the insulating body 31 is located between an end of the drain interconnection 29 and the boundary, which is between the n-type drift region 7 and the insulating body 16, on the x-axis. The first end of the insulating body 31 is located at least above an upper corner closer to the n$^+$-type drain region 17 out of two upper corners of the insulating body 16. The second end of the insulating body 31 is located on the insulating body 18, e.g., closer to the contact plug 28.

A conductive body 32 is provided continuously on an upper surface of the insulating body 31. The conductive body 32 has a first end and a second end. The first end and the second end of the conductive body 32 match the first end and the second end of the insulating body 31, respectively. "Match" refers herein to a fact that one end of the insulating body 31 and one end of the conductive body 32 are aligned on the x-axis as a result of forming the insulating body 31 by partially removing an insulating body using the conductive body 32 as a mask, and includes a mismatch due to an error during the formation. The conductive body 32 contains, for example, conductive polysilicon or is formed from, for example, conductive polysilicon. A given potential may be applied to the conductive body 32 or the conductive body 32 may be in an electrically floating state.

The first end (end closer to the p-well 6) of the insulating body 31 and the first end (end closer to the p-well 6) of the gate electrode 21 are covered with the side wall insulating body 22. The second end (end closer to the n-well 8) of the insulating body 31 and the second end (end closer to the n-well 8) of the gate electrode 21 are covered with the side wall insulating body 22.

An insulating body 34 is provided in the region that contains the upper surface of the deep n-well 5. The insulating body 34 is formed by the STI. The capacitor 3 is provided on an upper surface of the insulating body 18 above the insulating body 34. The capacitor 3 includes a conductive body 35, an insulating body 36, and a conductive body 37. The conductive body 35 is located on the upper surface of the insulating body 18. The conductive bodies 35 and 21 are derived from the same conductive body and formed from part of a given conductive body. That is, the conductive bodies 35 and 21 are formed by partially removing the given conductive body. The conductive body 35, therefore, contains, for example, polysilicon or is formed from, for example, polysilicon.

The insulating body 36 is located on an upper surface of the conductive body 35. The insulating bodies 36 and 31 are derived from the same insulating body and formed from part of a given insulating body. That is, the insulating bodies 36 and 31 are formed by partially removing the given insulating body.

The conductive body 37 is located on an upper surface of the insulating body 36. The conductive bodies 37 and 32 are derived from the same conductive body and formed from part of a given conductive body. That is, the conductive bodies 37 and 32 are formed by partially removing the given conductive body. The conductive body 37, therefore, contains, for example, polysilicon or is formed from, for example, polysilicon.

The conductive bodies 35 and 37 may be part of an element other than the capacitor 3. That is, the element, which contains the conductive bodies 35 and 37, other than the capacitor 3 may be mounted together with the transistor 2 on the semiconductor device 1 in a mixed fashion.

1.2. Advantages (Effects)

According to the first embodiment, it is possible to provide the semiconductor device having a high breakdown voltage, a low on-resistance, and high reliability, as will be described below.

Generation, an intensity, and (or) a distribution of an electric field of a given region in a substrate are affected by an interconnection which is located around this region and to which a potential is applied during an operation. Specifically, the electric field of the given region in the substrate is affected by disposition of this region and the interconnection around this region and (or) a distance between this region and the interconnection and (or) a shape or the like of the interconnection.

The semiconductor device 1 according to the first embodiment includes the conductive body 32 containing a part located between the substrate 4 and the drain interconnection 29. An electric field generated in the substrate 4 is affected by a distance between the substrate 4 and any of the conductive bodies around the substrate, particularly the drain interconnection 29 to which a high potential is applied during the operation of the transistor 2. The electric field generated in the substrate 4 becomes weaker as a position of the drain interconnection 29 is farther from the substrate 4. This is because the electric field is inversely proportional to a distance between two portions in the region where the electric field may be generated. However, it is sometimes impossible to easily locate the position of the drain interconnection 29 apart from the substrate 4. According to the first embodiment, the conductive body 32, in which a potential may be generated, is provided between the drain interconnection 29 and the substrate 4. This conductive body 32 can change a distribution of the electric field between the substrate 4 and the drain interconnection 29 and it is possible to mitigate an intensity of the electric field generated in the substrate 4 by applying the potential to the drain interconnection 29.

Furthermore, the conductive body 32 also contains a part located between the substrate 4 and the drain contact plug 28. The conductive body 32, in which the potential may be generated, between the drain contact plug 28 and the substrate 4 can mitigate the intensity of the electric field generated in the substrate 4 by applying a potential to the drain contact plug 28 on the basis of the same mechanism as that described in relation to the part located between the substrate 4 and the drain interconnection 29.

Moreover, according to the first embodiment, it is possible to reduce the intensity of the electric field in a portion having a particularly high electric field in the substrate 4, and eventually generation of impact ionization as will be described below.

In transistors including the transistor 2 illustrated in FIG. 1, a strong electric field tends to be generated in a part closer to a drain among parts below a gate electrode in the substrate. The strong electric field reduces the breakdown voltage of the transistor.

Furthermore, the strong electric field turns electrons passing through a region of the strong electric field into hot carriers, and the hot carriers may cause the impact ionization. Characteristics of the transistor may be changed by trap of electrons generated by the impact ionization by an insulating body such as a gate insulating body or an insulating body formed by the STI. These respects mean a reduction in reliability of the transistor.

Figure 2:
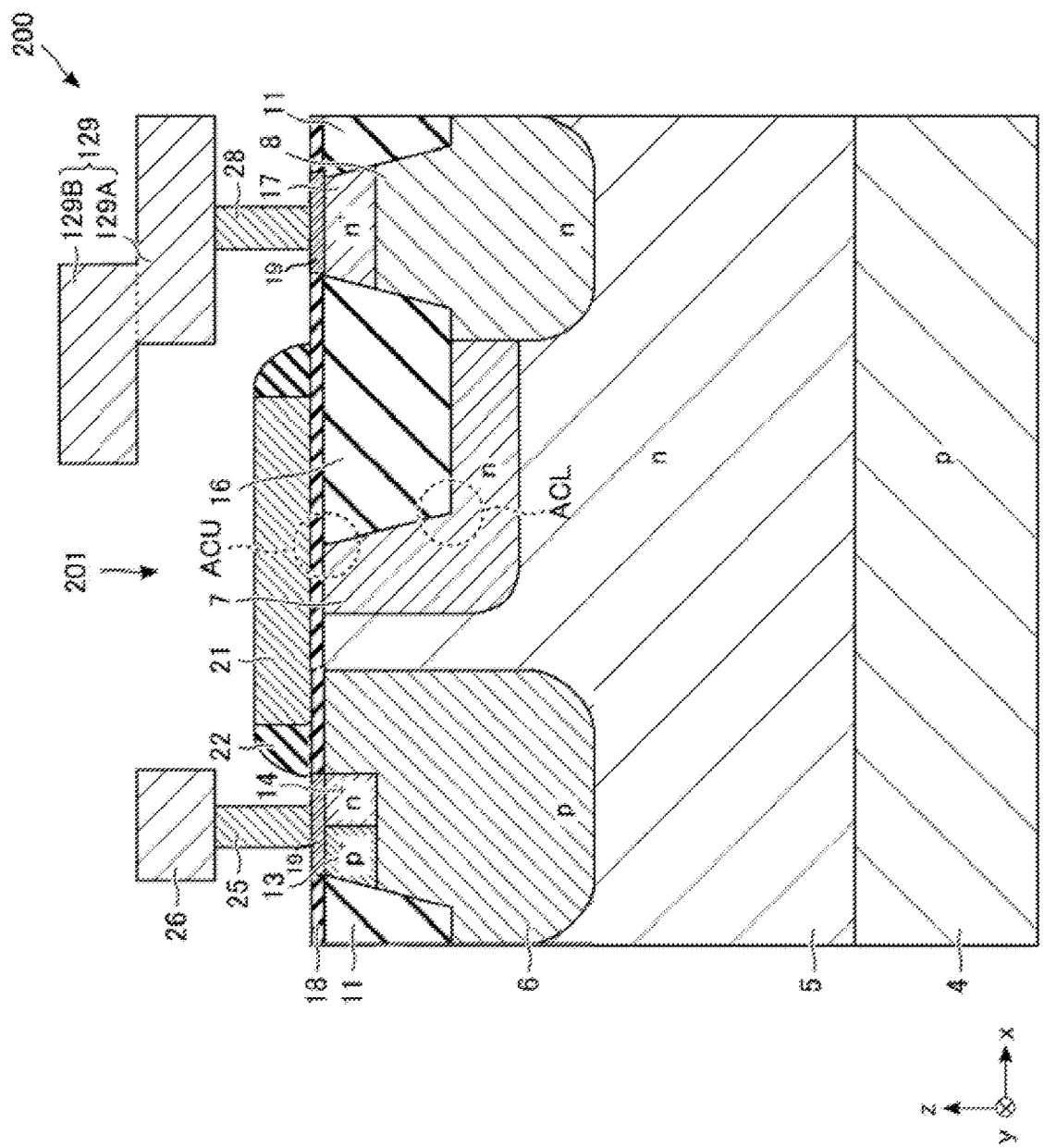
FIG. 2 illustrates a cross-sectional structure of a semiconductor device for reference.

The inventors conducted a simulation for a distribution of an electric field and a distribution of impact ionization based on a difference in a shape of a drain interconnection. The simulation was conducted for a semiconductor device 1 including a transistor and a semiconductor device 200 including a transistor 201. The semiconductor device 200 has a structure obtained by removing the insulating body 31 and the conductive body 32 from the structure of the semiconductor device 1. Since the insulating body 31 and the conductive body 32 are not provided in the semiconductor device 1, each side surface of the gate electrode 21 is covered with the side wall insulating body 22 as illustrated in FIG. 2 to be described later.

The semiconductor device 200 is similar to the semiconductor device 1. That is, the semiconductor device 1 includes the drain interconnection 29 similarly to the semiconductor device 1, while the semiconductor device 200 has a drain interconnection 129 as an alternative to the drain interconnection 29, as illustrated in FIG. 2. The drain interconnection 129 has a shape of a staircase. That is, the drain interconnection 129 includes a first part 129A that comes in contact with the contact plug 28 and that is located at a first height and a second part 129B that is located above the gate electrode 21 and that is located at a second height larger than the first height. In other words, the second part 129B, which overlaps the gate electrode 21 in a plan view, of the drain interconnection 129 is provided apart from the gate electrode 21.

It was found from a result of the simulation that the transistor 201 had a weaker electric field than that of the transistor 2 in a region ACU, which came in contact with the insulating body 16, in the region that contained the upper surface of the n-type drift region 7 and a region ACL, which came in contact with a lower corner of the insulating body 16, in the n-type drift region 7. It was also found that generation of the impact ionization was less in the regions ACU and ACL of the transistor 201 than in the transistor 2 due to the weaker electric field. This result of the simulation is considered to be caused at least in part by location of the second part 129B of the drain interconnection 129 above the gate electrode 21 at the higher position than positions of other parts (e.g., the first part 129A).

In the first embodiment, the electric field is generated in the conductive body 32 by applying a voltage to the conductive body 32. Owing to this, the electric field is generated in the conductive body 32 by applying the potential to the drain interconnection 29. Therefore, disposition of (i.e., a relative position relationship among) the drain interconnection 29, the conductive body 32, and the substrate 4 in which the electric field is generated by application of the potential to the drain interconnection 29 is similar to disposition of the second part 129B of the drain interconnection 129, the first part 129A of the drain interconnection 129, and the substrate 4 in the semiconductor device 200 for reference. Therefore, the drain interconnection 29, the conductive body 32, and the substrate 4 play roles, which correspond to roles of the second part 129B of the drain interconnection 129, the first part 129A of the drain interconnection 129, and the substrate 4, respectively, in the generation of the electric field in response to the application of the potential to the drain interconnection 29. As a result, in the transistor 2, like the transistor 201, the generated electric field is weaker and the generated impact ionization is less in the regions ACU and ACL than those in the transistor 2. Therefore, the transistor 2 has the higher breakdown voltage and the higher reliability than those of the transistor 2.

Moreover, according to the first embodiment, the insulating body 31 is formed from the same insulating body as the insulating body 36 of the capacitor 3, and the conductive body 32 is formed from the same conductive body as the conductive body 37 of the capacitor 3. The insulating body 31 and the conductive body 32 can be formed in processes of forming the insulating body 36 and the conductive body 37 of the capacitor 3 that are formed irrespectively of whether the insulating body 31 and the conductive body 32 are formed. Therefore, it is unnecessary to add processes of forming the insulating body 31 and the conductive body 32 and it is possible to easily form the insulating body 31 and the conductive body 32.

1.3. Examples (Modifications) of Other Structures of Transistor

As described with reference to FIG. 1, the transistor 2 is the MOSFET having the planar structure and may have any of the structures in which the source, the gate electrode, and the drain are aligned on the xy plane. Other examples of the transistor 2 and the semiconductor device 1 including the transistor 2 will be described hereinafter. Differences from the semiconductor device 1 will be mainly described in the examples, hereinafter.

Figure 3:
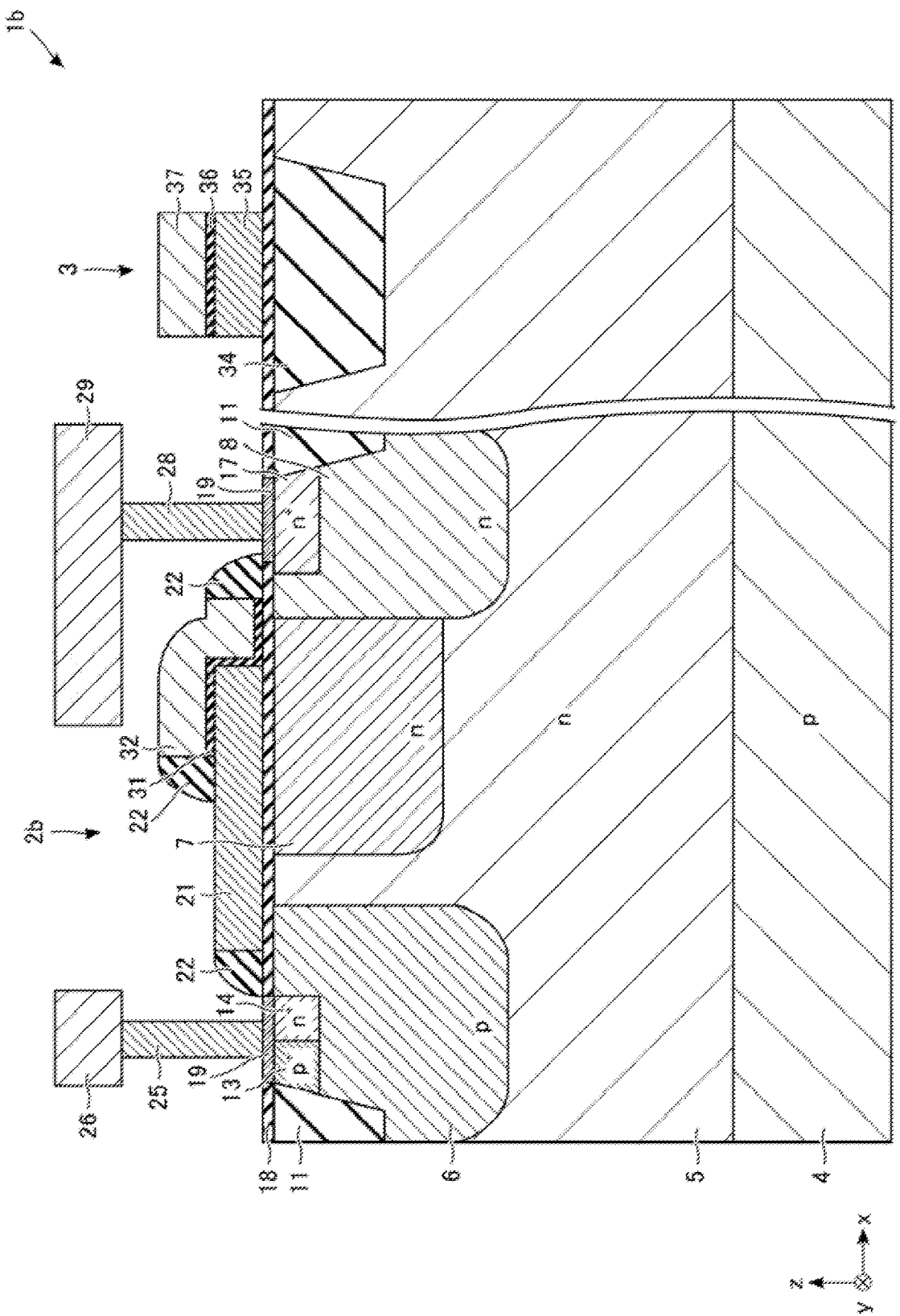
FIG. 3 illustrates a cross-sectional structure of a semiconductor device according to another example of the first embodiment.

FIG. 3 illustrates a cross-sectional structure of a semiconductor device according to another example of the first embodiment. A semiconductor device 1b includes a transistor 2b. The transistor 2b differs from the transistor 2 in that the transistor 2b does not include the insulating body 16.

Figure 4:
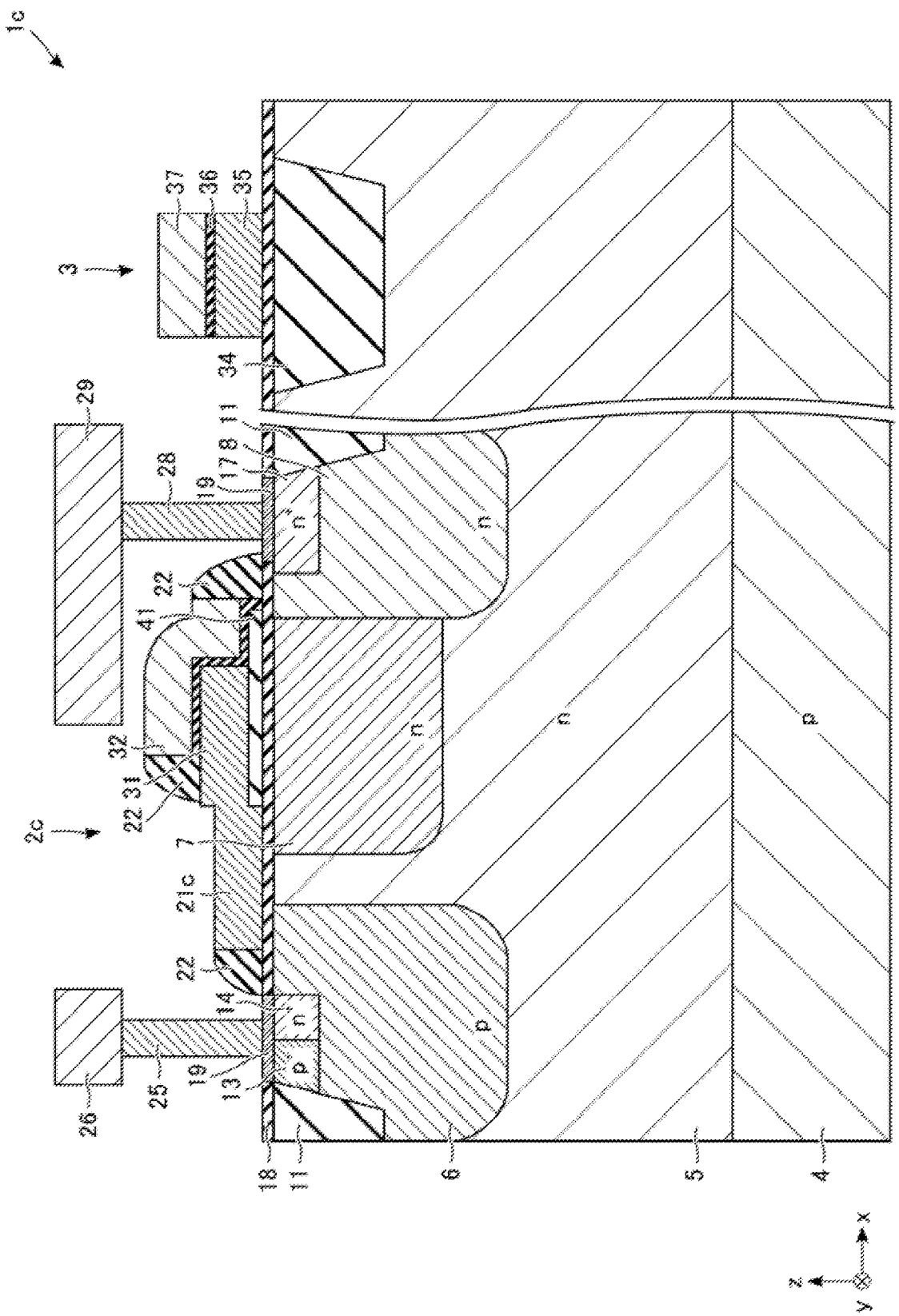
FIG. 4 illustrates a cross-sectional structure of a semiconductor device according to another example of the first embodiment.

FIG. 4 illustrates a cross-sectional structure of a semiconductor device according to another example of the first embodiment. A semiconductor device 1c includes a transistor 2c and the transistor 2c includes a gate electrode 21c. The semiconductor device 1c does not include the insulating body 16 and includes an insulating body 41. The insulating body 41 is located above part of the upper surface of the insulating body 18, and extends over a region above the n-type drift region 7 and a region above the n-well 8. The gate electrode 21c is partially located on an upper surface of the insulating body 41. The gate electrode 21c has a bottom surface located at a higher position than positions of bottom surfaces of the other parts in a part on the insulating body 41.

Figure 5:
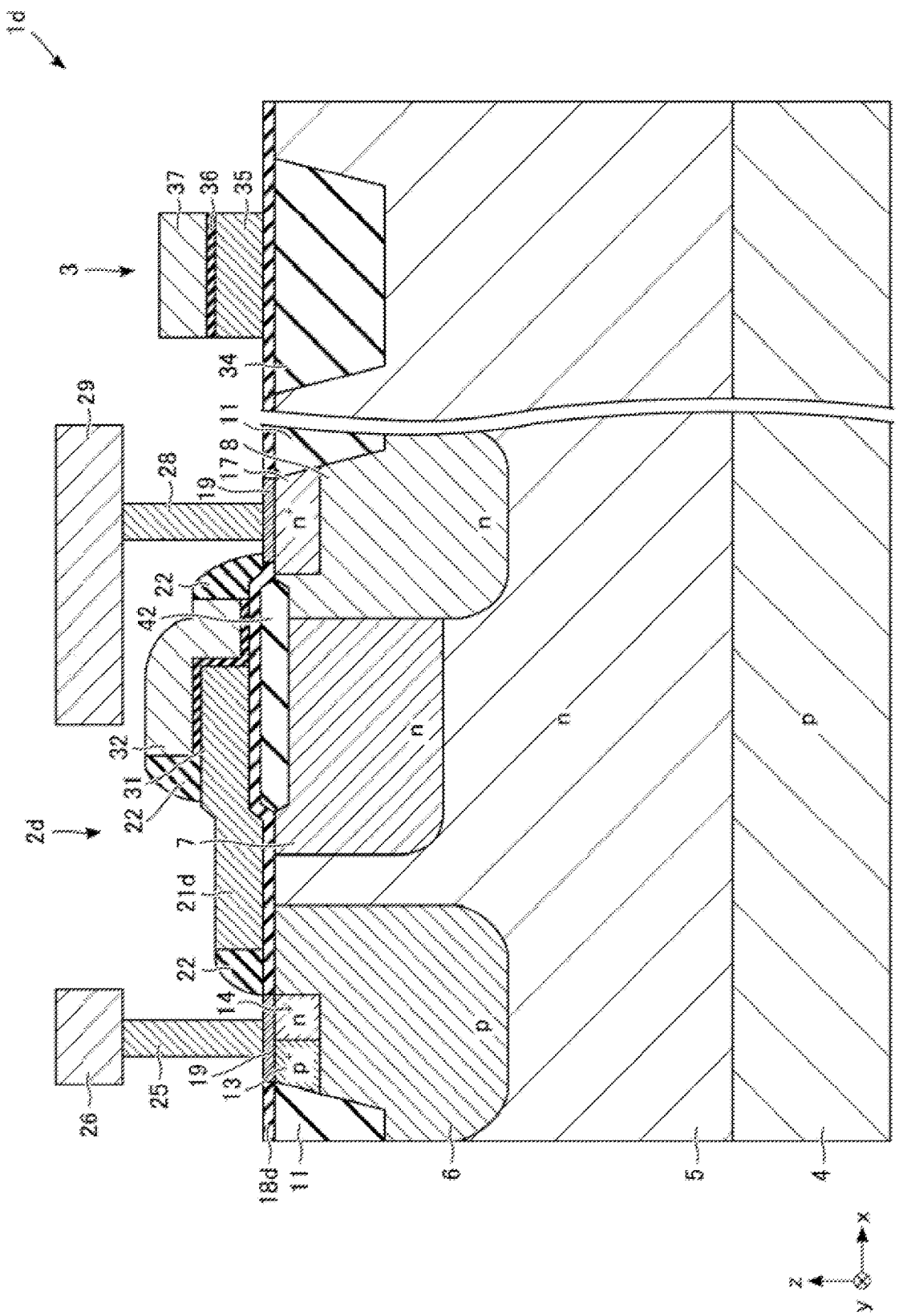
FIG. 5 illustrates a cross-sectional structure of a semiconductor device according to another example of the first embodiment.

FIG. 5 illustrates a cross-sectional structure of a semiconductor device according to another example of the first embodiment. A semiconductor device 1d includes a transistor 2d and the transistor 2d includes a gate electrode 21d. The semiconductor device 1d does not include the insulating body 16 and includes an insulating body 42. The insulating body 42 extends over the region above the n-type drift region 7 and a region above the $n^+$-type drain region 17. The insulating body 42 is formed by LOCOS (LOCal Oxidation of Silicon). The insulating body 42, therefore, rises from the upper surface of the substrate 4. An insulating body 18d is partially located on an upper surface of the insulating body 42 and, therefore, partially extends along the upper surface of the insulating body 42. The gate electrode 21d has a bottom surface located at a higher position than positions of bottom surfaces of the other parts in a part on the insulating body 42.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:
1. A semiconductor device comprising:
a semiconductor substrate;
a first well of a first conductivity type in a surface region that comprises a surface of the semiconductor substrate;
a first impurity region of a second conductivity type in a region of a surface of the first well;
a second impurity region of the first conductivity type, a portion of the first well being located between the second impurity region and the first impurity region in the surface region of the semiconductor substrate;
a first insulating body on the surface of the semiconductor substrate;
a gate electrode extending over part of the first well and part of the second impurity region on the first insulating body;
an interconnection extending in a region above the gate electrode and the first insulating body;

a second insulating body extending on an upper surface of the gate electrode and over a region above the second impurity region; and a first conductive body on the second insulating body and below the interconnection.

2. The semiconductor device according to claim 1, further comprising:
a first contact plug that contacts the second impurity region and the interconnection.

3. The semiconductor device according to claim 2, wherein
the first insulating body contacts the second impurity region,
the second insulating body is located on the first insulating body above the second impurity region, and
the first conductive body is located on the second insulating body above the second impurity region.

4. The semiconductor device according to claim 3, wherein the first conductive body faces the first contact plug.

5. The semiconductor device according to claim 2, wherein the second impurity region includes:
a third impurity region that contacts the first well; and
a second well that contacts the third impurity region and the first contact plug,
the gate electrode extends over a region above the first well and a region above the third impurity region, and
the first conductive body extends over a region above the upper surface of the gate electrode and the region above the third impurity region.

6. The semiconductor device according to claim 1, further comprising a third insulating body located in a region that comprises a surface of the second impurity region, wherein the first insulating body is located on the third insulating body.

7. The semiconductor device according to claim 1, further comprising a third insulating body located in a region that comprises a surface of the second impurity region, wherein
a side surface of the third insulating body is apart from the first well,
a bottom surface of the third insulating body is apart from a bottom surface of the second impurity region, and
the first insulating body is located on the third insulating body.

8. The semiconductor device according to claim 1, further comprising a fourth insulating body located on the first insulating body above the second impurity region, wherein
the gate electrode is located on the fourth insulating body,
the second insulating body is located on the fourth insulating body above the second impurity region, and
the first conductive body is located on the second insulating body above the second impurity region.

9. The semiconductor device according to claim 2, further comprising a silicide between the second impurity region and the first contact plug.

10. A semiconductor device comprising:
a semiconductor substrate;
a first well of a first conductivity type in a surface region that comprises a surface of the semiconductor substrate;
a first impurity region of a second conductivity type in a region of a surface of the first well;
a second impurity region of the first conductivity type, a portion of the first well being located between the second impurity region and the first impurity region in the surface region of the semiconductor substrate;
a first insulating body on the surface of the semiconductor substrate;
a gate electrode extending over part of the first well and part of the second impurity region on the first insulating body;
a second insulating body that has a first end and a second end extending on an upper surface of the gate electrode and over a region above the second impurity region; and
a first conductive body that has a first end and a second end on the second insulating body,
wherein, the first and second ends of the conductive body match the first and second end of the insulating body, respectively.

11. A semiconductor device comprising:
a semiconductor substrate;
a first well of a first conductivity type in a surface region that comprises a surface of the semiconductor substrate;
a first impurity region of a second conductivity type in a region of a surface of the first well;
a second impurity region of the first conductivity type, a portion of the first well being located between the second impurity region and the first impurity region in the surface region of the semiconductor substrate;
a first insulating body on the surface of the semiconductor substrate;
a gate electrode extending over part of the first well and part of the second impurity region on the first insulating body;
a second insulating body that has a first end and a second end extending on an upper surface of the gate electrode and over a region above the second impurity region; and
a first conductive body that has a first end and a second end on the second insulating body,
wherein the first end of the second insulating body and a first end of the gate electrode are covered with a side wall insulating body, and the second end of the second insulating body and a second end of the gate electrode are covered with the side wall insulating body.

* * * * *